United States Patent
Koduri et al.

(10) Patent No.: US 6,597,963 B2
(45) Date of Patent: Jul. 22, 2003

(54) SYSTEM AND METHOD TO RECREATE ILLUMINATION CONDITIONS ON INTEGRATED CIRCUIT BONDERS

(75) Inventors: Sreenivasan K. Koduri, Plano, TX (US); David J. Bon, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 160 days.

(21) Appl. No.: 09/864,576

(22) Filed: May 24, 2001

(65) Prior Publication Data

US 2001/0047366 A1 Nov. 29, 2001

Related U.S. Application Data (60) Provisional application No. 60/206,493, filed on May 23, 2000.

(51) Int. Cl.[7] .............................................. H01L 21/603
(52) U.S. Cl. .................... 700/121; 700/125; 700/56; 700/57; 700/109
(58) Field of Search .............................. 700/121, 125, 700/212, 57, 56, 109

(56) References Cited

U.S. PATENT DOCUMENTS

| | | | |
|---|---|---|---|
| 5,059,559 A | * 10/1991 | Takahashi et al. | 228/105 |
| 5,532,739 A | * 7/1996 | Garakani et al. | 348/87 |
| 5,640,199 A | * 6/1997 | Garakani et al. | 348/87 |
| 5,676,302 A | * 10/1997 | Petry, III | 228/104 |
| 5,861,909 A | * 1/1999 | Garakani et al. | 348/87 |
| 6,008,905 A | * 12/1999 | Breton et al. | 356/402 |

* cited by examiner

Primary Examiner—Leo Picard
Assistant Examiner—Michael D. Masinick
(74) Attorney, Agent, or Firm—Wade James Brady, III; Frederick J. Telecky, Jr.

(57) ABSTRACT

A computerized system and method for recreating illumination conditions in a slave bonder, prepared to attach connecting bonds onto bond pads of a slave integrated circuit. First, images of illuminated alignment references of a master circuit on a master bonder are defined; these data are analyzed to construct relationships between reference images and bond locations; data and relationships are stored in a master file. Secondly, on a slave bonder, the master reference image data are regenerated so that the illumination conditions of the slave bonder, as based on images, are recreated. Thirdly, images of the slave circuit references are produced under the newly created illumination conditions, and the alignment references are compensated. Finally, the bonding locations of the slave circuit and the bonding program of the slave bonder are corrected so that connecting bonds can be attached onto the recomputed correct bond locations.

28 Claims, 5 Drawing Sheets

SYSTEM AND METHOD TO RECREATE ILLUMINATION CONDITIONS ON INTEGRATED CIRCUIT BONDERS

This application claims the benefit of provisional application No. 60/206,493 filed May 23, 2000.

FIELD OF THE INVENTION

The present invention is related in general to the field of semiconductor devices and electronic systems and more specifically to reduced-error set-ups and operation of computer-controlled bonding machines used in integrated circuit assembly.

DESCRIPTION OF THE RELATED ART

In integrated circuit (IC) assembly, an IC chip is typically mounted on a leadframe and electrically connected to it by metallic segments. Commonly, the chip assembly is encapsulated in a protective package (for instance, ceramic package, or plastic package using molding process). Typically, the IC chip has a plurality of bond pads, which are often positioned around the chip perimeter; these bond pads have predetermined bonding area and spacing (bond pad pitch). The leadframe usually has a plurality of narrow "inner" leads for attachment to the segments and inclusion in the package, and a plurality of wider "outer" leads for attachment to other parts such as solder attachment to circuit boards.

The metallic segments used for electrical connection of the IC chip to the leadframe include wires and ribbons, and are attached by ball bonding, stitch bonding, or wedge bonding techniques. Wire bonding is a process in which a wire may be welded from a chip bond pad to the tip of an inner lead of the leadframe. As an example, in wire ball bonding the ball is attached to the chip bond pad and the stitch to the leadframe inner lead. For a given device type, there is a set of locations expressed in x and y coordinates which defines the bond locations on the chip and on the lead tips. These locations are generally stored collectively in a computer file, sometimes referred to as "Device Program". Apart from the bond head, capable of providing x-y-z motion needed for bonding, a wire bonder has a material handling subsystem and the vision subsystem.

Conventional semiconductor computerized wire bonders use x-y tables to move the bonding capillary over the device for bonding between the chip and the leadframe. The x-y coordinate tables are driven by complex electrical and mechanical components that may convert rotary and linear motions of the axis drive motors to create the needed positioning. The bond head also carries several other components such as the z-axis drive motor, a camera and optics for vision functions, and further components required to control wire bonding. Specific features of the capillary and its alignment are described in a number of U.S. Patents and Patent Applications. Examples are: U.S. Pat. No. 5,934,543, issued on Aug. 10, 1999 (Koduri et al., "Wire Bonding Capillary having Alignment Features"); and application Ser. No. 08/993,638, filed on Dec. 18, 1997 (Koduri, "Wire Bonding with Capillary Realignment"). The interaction of capillary and vision system is illustrated, for example, by U.S. patent application Ser. No. 09/191,812, filed on Nov. 13, 1998 (Koduri et al., "Automation of Optics Offset Measurement on Wire Bonders"); Ser. No. 09/111,642, filed on Jul. 8, 1998 (Koduri et al., "An Efficient Hybrid Illuminator"); Ser. No. 09/111,977, filed on Jul. 8, 1998 (Koduri et al., "An Efficient Illumination System for Wire Bonders").

The material handling system moves a leadframe so that each device can eventually be placed under the bond head for bonding. One or more devices may be placed under the bond head at a time to be bonded. The device may also be heated in a predetermined manner to establish reliable metallurgical bonding conditions. After a device has been bonded, the leadframe is step-moved such that the next unit can be bonded.

When a unit is indexed in by the material handling system for bonding, the position of the leadframe and the chip is not always the same because of variations in the handling and previous manufacturing (such as variable chip positioning during attachment to the leadframe). Without knowing accurately the target bonding locations, the bond head cannot place the bonds as expected. To aid this process, a machine vision system is employed. A typical vision system consists of a set of optics to provide the needed illumination and magnification of the device, a camera to capture the image provided by the optics and an image processing system to store and analyze the captured image.

Before bonding a device, it is essential to determine the device program with all the coordinate locations of the bonds that need to be created. With respect to a predetermined set of reference locations, those locations are often referred to as "homes". A typical device may have one or more "homes". Generally, the identification of homes needs to be done individually for each device to be bonded. It is common practice to use a three-step process to enable such identification.

In the step of "teaching", the coordinate locations of the homes and all the needed bonds are identified and saved to create the "device program". Once generated, a device program can be stored, copied and/or shared between multiple machines as needed.

In the step of "regeneration", a human operator helps in locating the homes of the first device after loading in the information from the previously saved device program. At this point, the machine captures and saves a set of images, called "reference images" or "references" in the neighborhood of each home.

In the step of "bonding", the machine indexes one unit or more at a time into the workstation under the bond head. At this point, the vision system, with the aid of a pattern recognition system, attempts to relocate the matching locations with the saved references. After finding the new coordinates of the matching references, the home and bond locations are re-computed for that specific unit from the device program data. The process of relocating the references and homes is normally referred to as "aligning" the device. Using the specific bond locations, the device can now be bonded. The process of indexing, aligning and bonding is repeated without any human intervention as long as nothing abnormal happens on the machine.

A typical alignment procedure may correct for a constant shift in x-y directions and/or a constant rotation of the device. In this context, it is important to understand the effects of variations in illumination settings across machines and the images formed using different levels of brightness. Large differences in intensity settings can reduce the ability of the pattern recognition system to locate the references accurately. It is very much desired to have a consistent level of brightness and image quality across all the machines used.

Problems in wire bonding techniques arise in part from the technology trends to increase the number of leads in a given package and to make IC chip packages smaller. As consequences, the bonding pads located on the chip receive smaller areas and are spaced closer together, and the inner leads of leadframes are made narrower and closer together. These trends demand tighter control of wire bond ball and stitch geometries and placements. For instance, even small bond placement errors may result in device loss.

For the bond machines, errors in x-y tables and motors need to be reduced. At the microscopic level, each axis of each table behaves differently with its own local variations within their usable regime. For instance, an axis might have a 0.5% error in its first half of working distance and a 0.8% error in its second half. Further, a x-y pair might have a global positioning error because of an error in the orthogonality between them; or the tables may exhibit a range of hysteresis errors. These variations become even more threatening as common device programs are shared due to quality enforcement and economic reasons.

The emerging technical problems for automated bond machines can be summarized as follows:

Accuracy: Small ball/fine pitch bonding requires a very accurate system to be able to place the ball completely on the bond pad. The current systems have difficulties in achieving this.

Large variations in illumination settings can lead to variations of the images as seen by the optics and the camera. These variations may affect the ability of the pattern recognition system in locating the homes and bond locations accurately.

The current systems cannot handle x-y table inconsistencies. For small pad/fine pitch bonding, a small error in ball placement can cause the ball to be partially off the pad.

Human error during regeneration of alignment program: Ball placement is greatly affected by the accuracy of the alignment program. There are many steps to this regeneration process and thus there are many chances for human error.

Time spent performing alignment regeneration: Whenever a device is to be bonded, a human operator typically has to spend a finite amount of time to perform an alignment regeneration.

An urgent need has therefore arisen for a fast, reliable and flexible system and method to reduce set-up time, reduce errors during creation and retrieval of bonding programs, compensate for machine variability, and standardize illumination conditions on bonding machines. The system and method should be flexible enough to be applied for different IC product families with a wide spectrum of design variations, and for different bond machines. The system and method should spearhead solutions toward the goals of improved product yield and reliability, preferably without investment in new equipment.

SUMMARY OF THE INVENTION

The present invention provides a computerized system and method for re-creating illumination conditions in a slave bonder, prepared to attach connecting bonds onto bond pads of a slave integrated circuit. First, images of illuminated alignment references of a master circuit on a master bonder are defined; these data are analyzed to construct relationships between reference images and bond locations; data and relationships are stored in a master file. Secondly, on a slave bonder, the master reference image data are regenerated so that the illumination conditions of the slave bonder, as based on images, are recreated. Thirdly, images of the slave circuit references are produced under the newly created illumination conditions, and the alignment references are compensated. Finally, the bonding locations of the slave circuit and the bonding program of the slave bonder are corrected so that connecting bonds can be attached onto the re-computed correct bond locations.

The present invention is related to high density ICs, especially those to be used at very high frequencies and having high numbers of input/outputs and tight constraints in package outline and profile. These ICs can be found in many semiconductor device families such as processors, standard linear and logic products, digital and analog devices, high frequency and high power devices, and both large and small area chip categories. Since the invention aims at designing devices with minimum geometries and high reliability, it supports continually shrinking applications such as cellular communications, pagers, hard disk drives, laptop computers and medical instrumentation.

It is an object of the present invention to provide an automated system and method for re-creating on a slave bonder and the circuit-to-be-bonded operating illumination conditions equivalent to the ones which prevailed on master and a master circuit. Alignment reference structures on the circuit are used as means for comparison and compensation. The master input data are entered manually by an expert, while the corrections are performed automatically. Constructing a network of relationships between the alignment references and the bond pads is also computerized. The object is achieved by an embodiment of the invention using a computer system and a computer-implemented method for automatically collecting, analyzing and storing the needed information.

Another object of the present invention is to provide a highly flexible system and method. This object is achieved by the embodiments of three subsystems of the invention: A master teacher/illuminator; a slave regenerator; and a slave corrector.

In the master teacher, a user-friendly manual input data generator selects alignment reference x-y locations, alignment reference images under specified illumination conditions, and bond pad x-y locations from a master circuit belonging to the same device family as the circuit-to-be-bonded ("slave circuit").

A computerized analysis generator establishes geometric relationships, expressed in x-y and polar coordinates, between the master circuit bond locations and alignment reference images; all data and relationships are stored in a master file as the master program.

In the slave regenerator, a computerized retriever downloads these data and relationships to a slave bonder designated to perform the bonding processes on the slave circuit.

An illumination selector, supplied with newly captured alignment reference images under various illumination conditions, recreates the equivalent illumination conditions that were used during the master program generation.

In the slave corrector, alignment reference images of the salve circuit are captured under the selected illumination conditions. With this input, a comparative corrector compares these images with alignment reference images from the master file, and corrects any shift, rotation, scaling or skewness detected between these two images or image parts. The retrieved relationships are then used to correct the slave circuit bond pad locations. Finally, the slave bonder is ready to perform the bonding processes on the re-computed pads of the slave circuit.

Another object of the present invention is to provide the newly computed bond locations in fast turn-around time and with minimum effort by taking full advantage of symmetries and branching in the computational flows of the input and analysis generators, the retriever, and the corrector.

Another object of the present invention is to introduce bond program teaching, loading ("regeneration") and correcting concepts which are flexible so that they can be applied to many families of electronic structures—reaching from piece parts, such as leadframes and interconnectors, to device packages, to electronic substrates, and to whole assemblies on motherboards—and are general so that they can be applied to several generations of products. Beyond the electronics realm, the computerized system and method of this invention can be generally applied to recreate the illumination conditions on slave machines prepared to work on action sites of slave objects, when a master machine and a master object, having a structure similar to the slave object, are available.

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

In current semiconductor assembly technology, large variations in illumination settings can lead to variations of the images as seen by the optics and the camera associated with computerized bonding machines ("bonders"). These variations may affect the ability of the pattern recognition system in locating the "homes" and bond pad locations accurately.

According to the present invention, the alignment references are digitally stored along with the coordinates of home positions in the device program during the "Master Teach" time. These stored images can be shared between multiple bonding machines as part of the device program. When a batch of devices need to be bonded. This device program will be loaded into the machine and the pattern recognition system may be used to automatically find the matching references. At the same time, the quality of the newly captured images may be compared with that of the stored images. As the stored images were generated during the program generation by an expert, they are considered to be the best quality images. Using any of the image comparison and/or quality measuring metrics, the illumination intensity may be automatically alerted to get the closest possible image quality. By repeating the same procedure on multiple machines, all of them can be made to reproduce the same quality of image that the expert has selected one during the program generation.

Such a procedure not only provides the standardization across the machines but also gives the optimization without human interference every time. Now with the illumination and thus the image quality reproduced, as taught by this invention, the pattern recognition system can be expected to perform at a much more precise level.

The stored reference images in the device program can also be used to fully automate the process of the "Regeneration"(which in conventional technology requires human operator's intervention). After optimizing the illumination intensity and the image quality, the pattern recognition system may be used to locate the matching references on the new device. From that and the coordinates data stored in the device program, the new homes can be automatically located without any assistance from the operator. At this point, one can recapture the references to get a more appropriate representation of the images on this individual machine. Doing this may compensate for minor differences that may affect the focusing and other image aberrations. By fully automating the image recapturing process, the traditional Regeneration can be fully eliminated.

Figure 1:
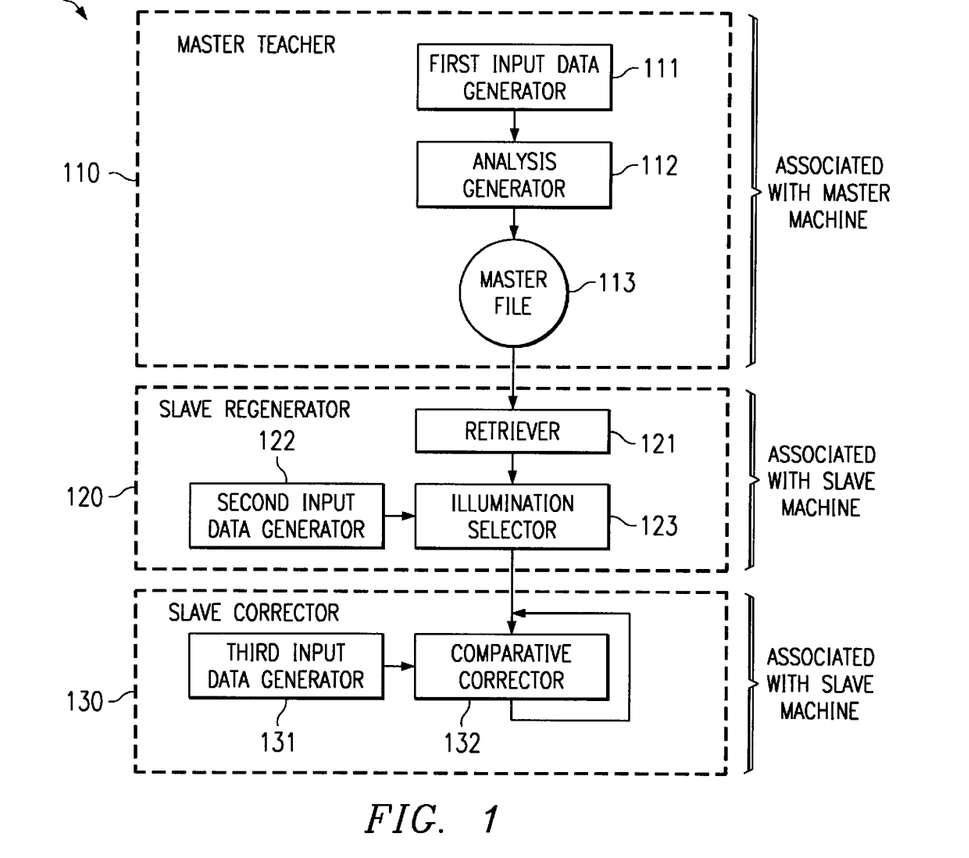
FIG. 1 illustrates a block diagram of a computer system for re-creating illumination conditions of a semiconductor chip assembly bonder according to the invention.

In order to highlight the conceptual breadth of the present invention, as summarized in the block diagram of FIG. 1, it should be pointed out that the contributing innovations come from three regimes of the assembly and bonding process:

Establishing the Master Bond Program ("Teaching")
  Defining bond locations (x-y parameters).
  Defining a set of alignment reference images.
  Relating the bond locations and alignment reference images locations in a network of relationships.
  Saving data and relationships in a master bond program.
Regenerating (Loading) on a Slave Machine
  Retrieving the saved master program onto another selected machine ("slave bonder").
  Capturing new alignment reference images with different illumination settings.
  Comparing illumination conditions of images and selecting best setting for this reference.
Bonding the Slave Circuit using Unit-Specific Corrections
  Capturing new device images under selected best illumination settings
  Identifying/quantifying any shifts, rotations, scalings or skewness between the saved master program and the circuit-to-be-bonded (slave circuit).
  Re-computing/correcting the bond locations to match the slave circuit.
  Bonding using the newly computed bond locations.

The above list shows that the invention uses automation in order to solve the problem in standard technology that a human operator has to be involved to correct the peculiar problems posed by the bonding under different illumination conditions.

The description of the invention based on FIG. 1 and the more detailed FIGS. 2 to 8 will illustrate that the invention is not restricted to ICs, bonders and bonding technology, but can be generalized to similar tasks in which a process is to be performed on objects with imperfections or deviations relative to a selected master object.

As illustrated schematically in the simplified block diagram of FIG. 1, the computerized system of the present invention, generally designated 100, operates to provide data generation as well as data analysis for creating corrected bonding instructions for the bonding process of an IC. The system provides three major parts: A master teacher 110, associated with a master circuit located on a master bonder; a slave regenerator 120, associated with a slave circuit located on a slave bonder; and a slave corrector 130, again associated with a slave circuit on a slave bonder.

The master teacher 110 collects data manually by a human expert. As the first step, the first data input generator 111 gathers geometrical information such as x-y locations of bond pads, x-y locations of alignment references, and images of these alignment references. All data is collected from a master IC which is related in geometry to the circuit-to-be-bonded, usually an IC of the same device type.

The first input data generator 111 is connected to an analysis generator 112, also associated with the master bonder and operated manually by a human expert, or automatically. The analysis generator 112 establishes relationships for the master bonder between the images of the alignment references and the geometrical information of the bond pads. Typically, these relationships are mathematical equations expressed in x-y and/or polar coordinates. The analysis generator 112 further constructs a network of these relationships. The generator then stores the network of relationships together with all data and the geometrical information of the bond pads and the images of the alignment references in the master file 113. These stored data are referred to as the master bond program. It is coupled to the master bonder, but also to any selected bonder working as slave bonder.

Associated with the slave bonder is the slave regenerator and its entry part, the retriever 121; it is operated by computer or, alternatively, manually by the user of the slave bonder. The retriever 121 is coupled to master file 113 and has the function of retrieving any and all information, and any of the relationships, stored in master file 113 for the benefit of the slave bonder.

Further associated with the slave bonder is the second input data generator 122, which collects images from alignment references on the circuit-to-be-bonded under various illumination conditions and makes them available in conjunction with the data retrieved by retriever 121.

The data from the second input generator 122 and from the retriever 121 are combined by the illumination selector 123 within the slave regenerator 120. The combined data are used to re-create the same illumination conditions on the slave bonder, which were employed during the device master program generation at the master bonder.

Further associated with the slave bonder is the slave corrector 130. It includes the third input data generator 131, which newly captures images of alignment references on the slave circuit obtained with the selected best illumination settings. These images are forwarded to the comparative corrector 132.

The comparative corrector 132 is coupled both to the illumination selector 123 and to the third input data generator 131. In one function, the comparative corrector 132 compares the newly generated alignment reference images with the retrieved master alignment references. In another function, the comparative corrector compensates any deviation found between the two sets of images. It further re-computes the slave circuit point locations based on the retrieved relationships between the reference locations and the bond locations, whereby the whole bond program of the slave bonder is re-computed. Directed by the re-computed bond program, the computerized slave bonder is enabled to attach the connecting bonds to the slave circuit bond pads to the correct bond pad locations, free of errors and manual operator interference.

The computerized system 100 is generally capable of recreating illumination conditions during creation and retrieval of an operational program in a slave machine which is prepared to work on action sites of a slave object. Examples are programs of machines which function to deposit materials onto object surfaces (for instance, by printing, inking or jetting), or which are to perform operations in a patterned arrangement (for instance, drilling of holes). The principals of this invention apply to these examples.

Figure 2:
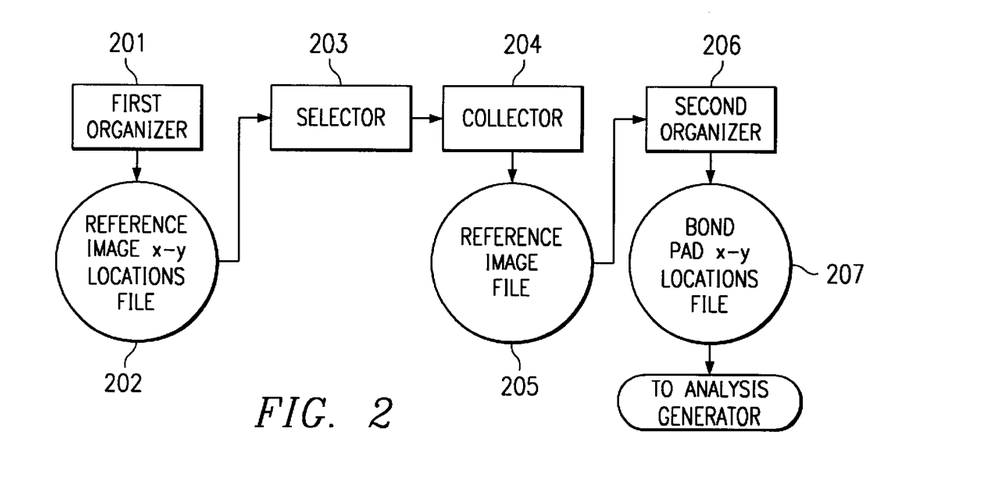
FIG. 2 illustrates a block diagram of the detail of the input data generator associated with the computerized master bonder.

FIG. 2 shows the first input data generator 111 in more detail. The first organizer 201 operates to select geometrical points of images of alignment reference structures. This "teaching" of the reference points can be performed manually. The organizer then collects the x-y locations describing the position and the size of the reference images, and stores these x-y locations data in file 202. Consequently, file 202 serves to save the reference image x-y locations.

File 202, and thus the first organizer 201, is coupled to the illumination selector 203. This selector manually selects various illumination conditions. Selector 203 is coupled to collector 204. This collector operates to collect the images proper of said alignment references and to store these images in the reference image file 205. This image collection can be performed manually.

File 205, and thus collector 204, is coupled to the second organizer 206. This second organizer 206 operates to select bond pads, to collect x-y locations describing the position and the size of the pads, and to store these x-y locations data in file 207. Consequently, file 207 serves to save bond pad point x-y locations. This "teaching" of the bond points can be performed manually.

Figure 3:
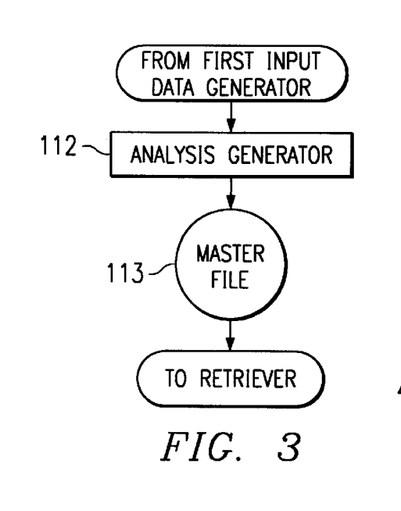
FIG. 3 illustrates a block diagram of the detail of the analysis generator and the master file associated with the computerized master bonder.

FIG. 3 shows the function of the analysis generator in more detail. The analysis generator 112 is a computerized relations builder. In its operation it first selects x-y locations of the bond pads; it then expresses their mutual geometries and their relationships to the alignment reference images. These relations comprise equations in x-y coordinates and polar coordinates. As a result, an interconnected network of relationships between bond pad points and reference images of the master circuit is established.

This interconnected network is stored in master file 113. Further, the master file contains all the geometrical data and the images of the bond pads as well as the alignment references. It thus represents the master bond program.

Figure 4:
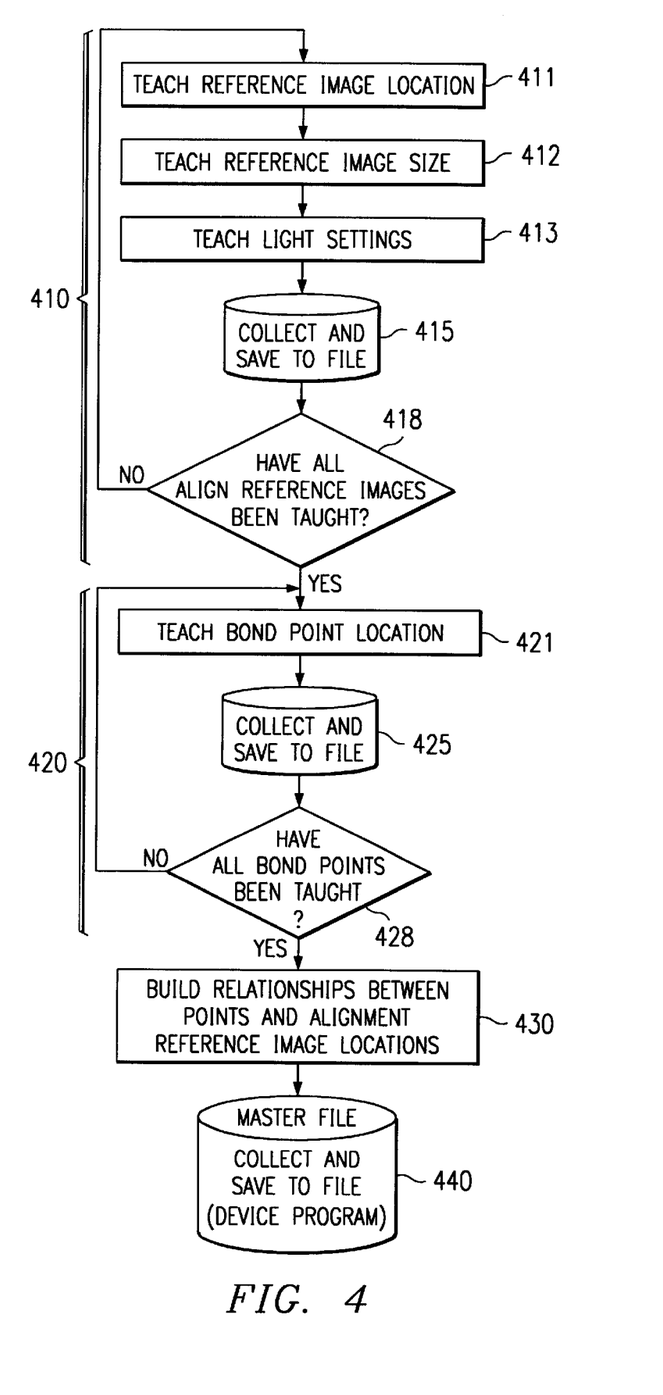
FIG. 4 is a process flow chart of the method used to generate inputs and analysis according to the invention.

The computerized method of generating input data and of performing and storing the analysis of the data according to the invention is described by the process flow of FIG. 4. The software loop 410 provides the alignment reference input data and the light settings, and the software loop 420 provides the bond pad input data. Loop 410 begins with three input steps:

411: Teaching reference image location;
412: Teaching reference image size; and
413: Teaching light settings.

The data collected from these three input sources are stored in file 415. After each acquisition loop, the question is asked in gate 418, whether all alignment reference images have been taught. As long as the answer is "no", another loop of data acquisition has to be performed. When the answer is "yes", the input process advances to the loop 420.

Bond pad points loop 420 begins with the input step:

421: Teaching bond point location.

The data collected from this input source are stored in file 425. After each acquisition loop, the question is asked in gate 428, whether all bond points have been taught. As long as the answer is "no", another loop of data acquisition has to be performed. When the answer is "yes", the input process advances to the analysis generator 430.

The data stored in file 415 together with the data stored in file 425 are used by the analysis generator 430 to construct the relationships between the bond pad points and the alignment reference images of the master circuit as described above. The resulting network of relations, together with all the data, is stored in master file 440 as the master bond program.

Figure 5:
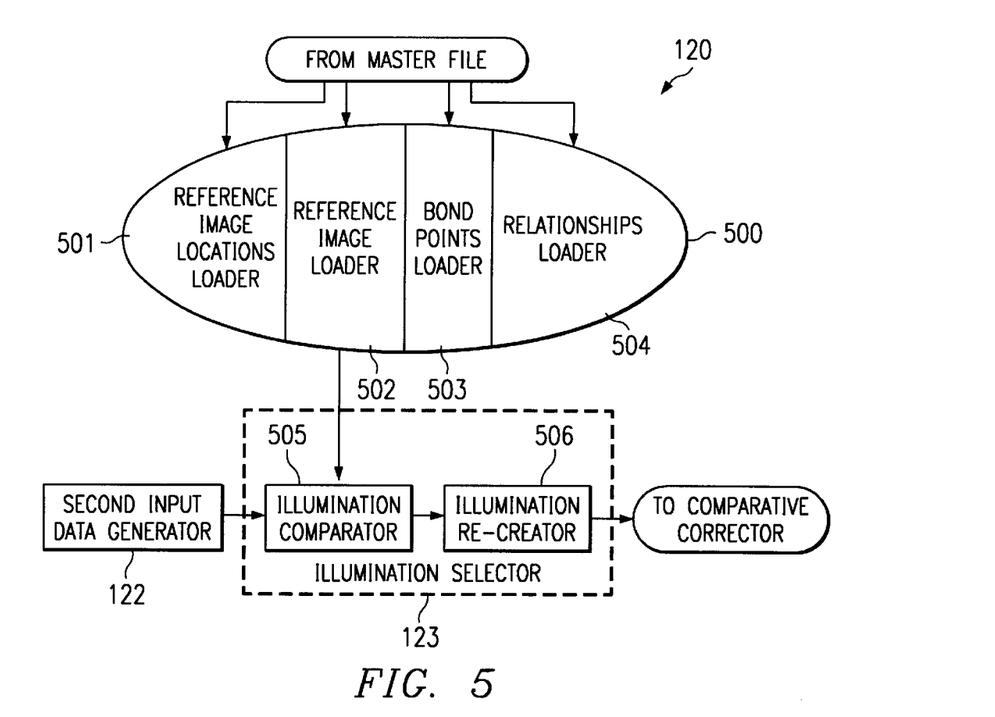
FIG. 5 illustrates a block diagram of the detail of the slave regenerator, the retriever and the illumination selector associated with the computerized slave bonder.

FIG. 5 is a block diagram of the detail of the slave regenerator (120 in FIG. 1), associated with the slave bonder. A major part of the slave regenerator is the retriever 500 (summarized as 121 in FIG. 1), which is coupled to the master file 113. The computerized retriever operates to download portions of the master bond program as needed. Consequently, the retriever 500 comprises:

an alignment reference image location loader 501, coupled to the master file, operable to download the stored master alignment reference x-y locations data;

an alignment reference image loader 502, coupled to the master file as well as to the reference image locations loader 501, operable to download the stored master alignment reference image data; The reference image loader 502 is coupled to the illumination comparator 505 within the illumination selector 123;

a bond points loader 503, coupled to the master file as well as to the reference image loader 502, operable to download the stored master bond pad x-y locations data;

a relationships loader 504, coupled to the master file as well as to the bond points loader 503, operable to download the stored relationships between the master bond point locations and the master alignment reference images.

Another part of the slave regenerator is the second input data generator 122. It captures fresh images of the alignment reference structures on the slave IC under various illumination conditions and forwards these images to the illumination comparator 505 within the illumination selector 123.

The computerized illumination comparator 505, coupled to the saved alignment reference image loader 502 and the second input data generator 122, compares the newly acquired images to the saved images in order to find the best illumination match. The illumination re-creator 506, coupled to the illumination comparator 505 within the illumination selector 123 selects and records the best illumination settings for each of the reference images, and forwards the result to the comparative corrector 132.

Figure 6:
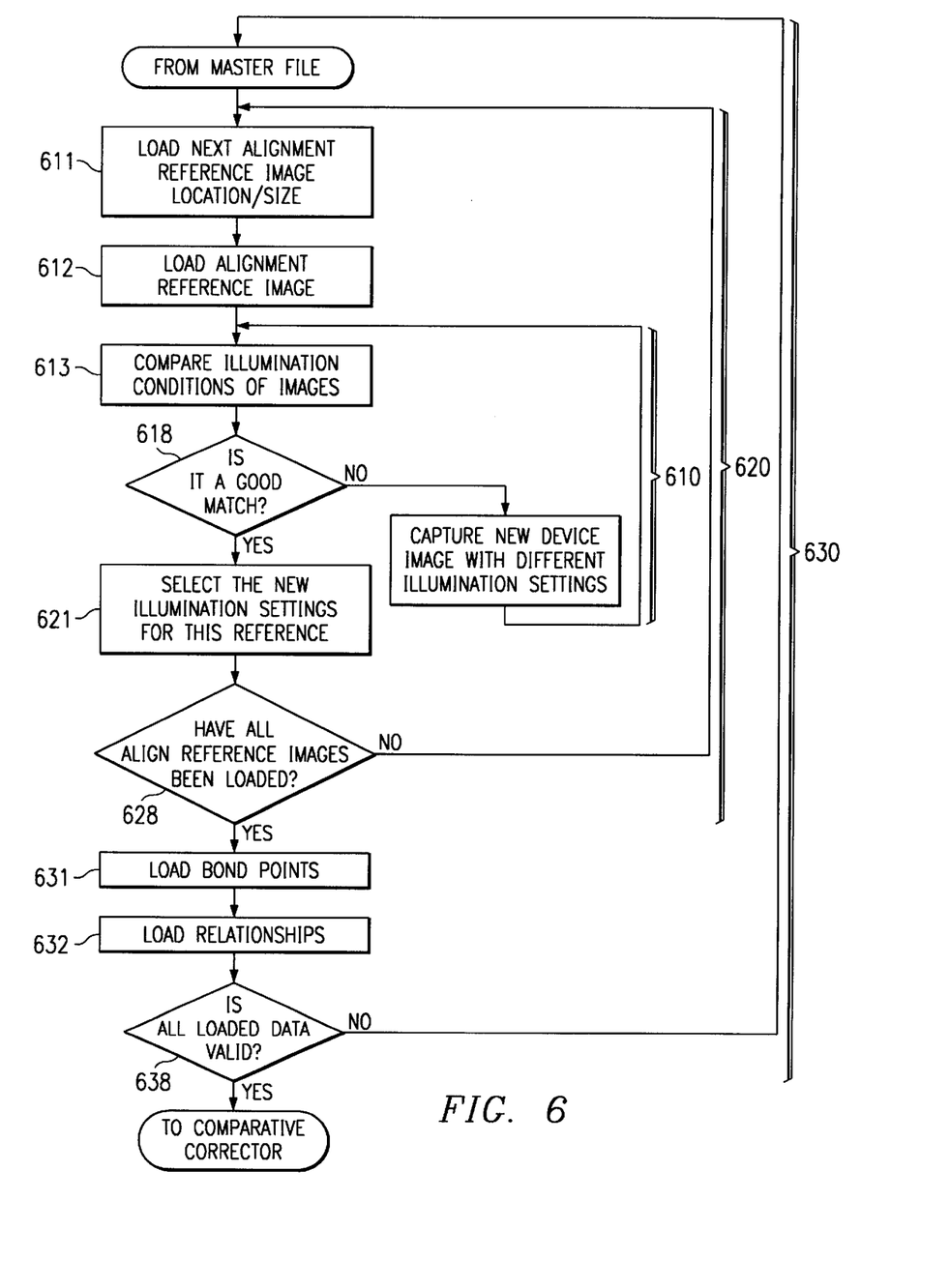
FIG. 6 is a process flow chart of the method used by the slave regenerator according to the invention.

The computerized method of retrieving data and selecting illumination conditions according to the invention is described by the slave regenerator process flow of FIG. 6. The software loop 610 provides the inputs from the second input data generator. The software loop 620 provides illumination comparison and selection. The software loop 630 provides the completeness. The process flow begins by selecting a device program from the master file, followed by two loading steps:

611: Downloading the next alignment reference image locations and size.

612: Downloading alignment reference image.

The process flow continues with loop 610:

613: Comparing illumination conditions of images. After each comparison, the question is asked in gate 618, whether the comparison resulted in a good match, i.e. a match indicating an illumination for the slave circuit image equivalent to the illumination employed for the master circuit image. As long as the answer is "no", another loop 610 of data comparing has to be performed; another image of the alignment reference structure, obtained with different illumination settings, has to be captured and supplied using the second input data generator. When the answer is "yes", the data advances to the selection step 621 in the illumination selector.

621: Selecting the new illumination setting for the alignment reference-under-study.

After each selection, the question is asked in gate 628, whether all alignment reference images have been loaded. As long as the answer is "no", another loop 620 of loading, comparing and selecting has to be performed. When the answer is "yes", the retriever can download additional data:

631: Downloading stored master bond pad x-y location data.

632: Downloading stored relationships between the master bond point locations and the master alignment reference images.

After these downloading steps, the question is asked in gate 638, whether all downloaded data is valid. As long as the answer is "no", another loop 630 of downloading from the master file has to be performed. When the answer is "yes", the slave regeneration process is completed and the process advances to the slave bond program corrector.

Figure 7:
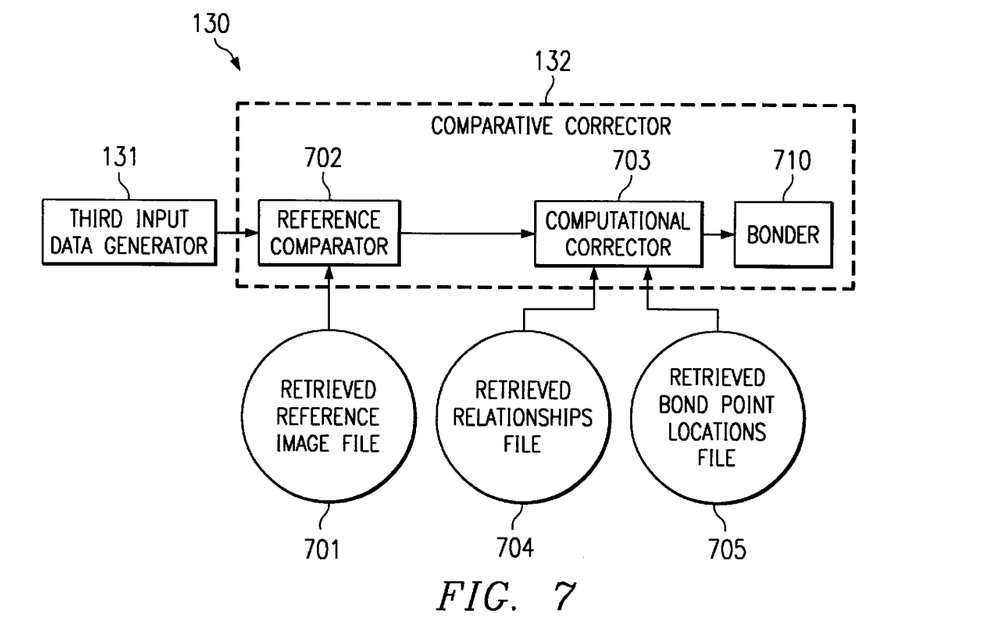
FIG. 7 illustrates a block diagram of the detail of the comparative corrector associated with the computerized slave bonder.

The illumination conditions selected in the slave regenerator 120 are used by the slave corrector 130, which is associated with the slave bonder and coupled to the illumination selector 123 discussed in FIG. 5. FIG. 7 shows the slave corrector 130 in more detail. The third input data generator 131 generates images of alignment references on the slave circuit under the selected best illumination conditions. The third input data generator is coupled to the comparative corrector 132.

Referring to FIG. 7, file 701 provides the alignment reference images retrieved from the master file. File 701 is coupled to the reference comparator 702. Reference comparator 702 operates to compare the alignment reference images stored in file 701 with the alignment reference images from the slave circuit provided by the third input generator 131. In this comparison, any deviations such as shifts, rotations, scalings, or skewness between the two images or image parts are identified and quantified and forwarded to the computational corrector 703.

The reference comparator 702 is coupled to the computational corrector 703. Further coupled to the computational corrector 703 are file 704 which provides the retrieved relationships between alignment reference image locations and bond point location, and file 705 which provides the bond pad point locations (x-y locations) retrieved from the master file.

The computational corrector 703 uses the quantitative data comparison provided by the data from the reference comparator 702, the bond point locations from file 705, and the retrieved relationships from file 704 to re-compute the bond pad locations on the circuit-to-be-bonded (slave circuit). The corrected coordinates (x-y locations) of the slave circuit bond pads can now be forwarded to the bonding machine (bonder) 710.

The computerized bonder 710, coupled to the computational corrector 703, operates as the slave bonder to attach the connecting bonds (wires, ribbons, balls, stitches, etc.) to the bond pads of the slave circuit under the direction of the re-computed bond pad locations (bond program) provided by the computational corrector 703.

Figure 8:
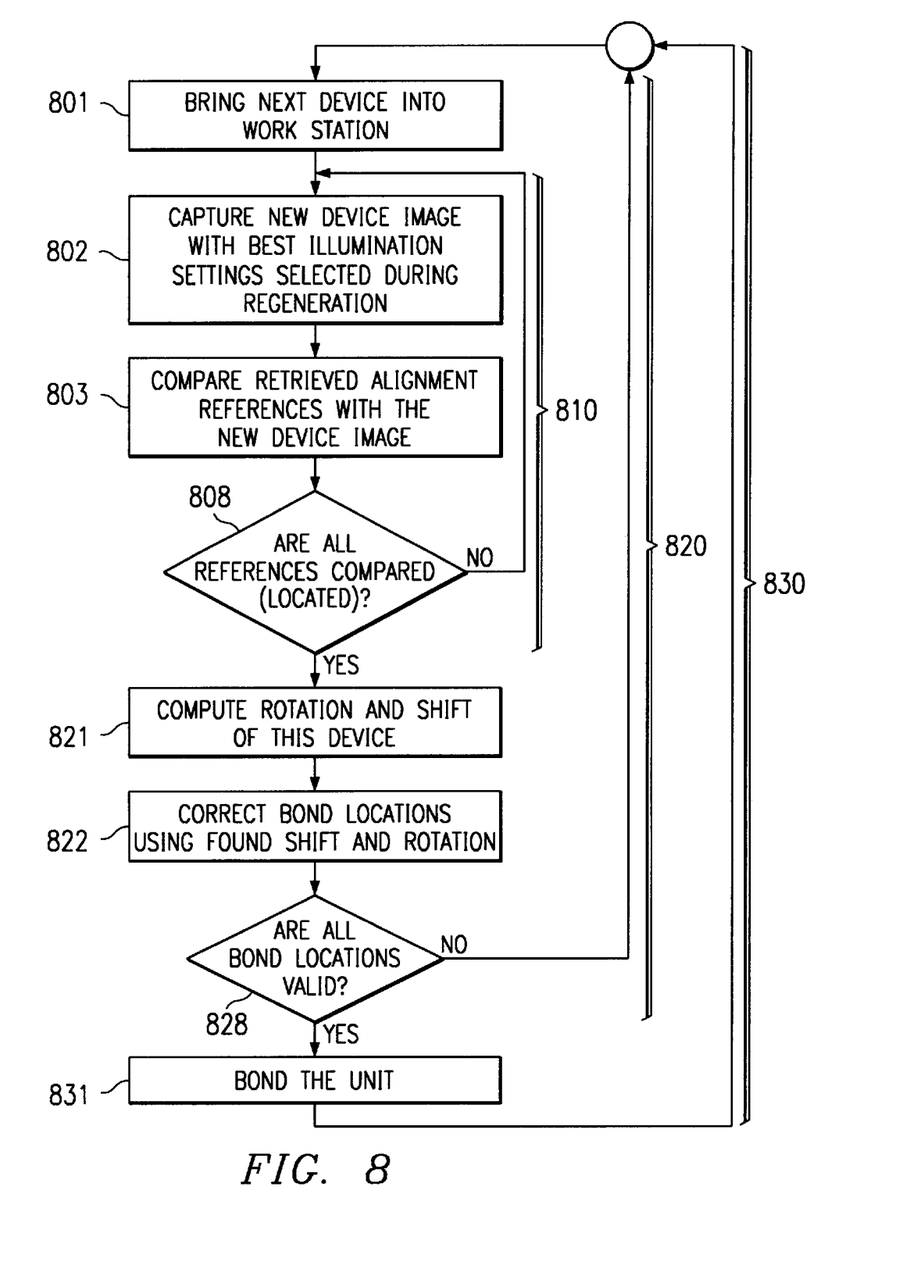
FIG. 8 is a process flow chart of the method used by the comparative corrector and the slave bond head according to the invention.

The computerized method of computing, correcting, and using bond pad data according to the invention is described by the process flow of FIG. 8. The process starts with the step of:

801: Bringing the next circuit-to-be-bonded (slave circuit) into the bonder work station (slave bonder).

802: Capturing new alignment reference images on the slave circuit with best ("equivalent") illumination settings selected in the regeneration process flow.

803: Comparing the new alignment reference images on the slave circuit with the retrieved alignment references.

After each comparison of a reference, the question is asked in gate 808, whether all references have been compared (located). As long as the answer is "no", another loop 810 of comparing references has to be performed. When the answer is "yes", the process flow advances to step 821:

821: Computing any shifts, rotations, scalings or skewness found on this slave circuit, as described in FIG. 7.

822: Re-computing the correct bond pad locations on the slave circuit.

After each re-computing, the question is asked in gate 828, whether all slave circuit bond pad locations are valid. As long as the answer is "no", another loop 820 of re-computing and correcting has to be performed. When the answer is "yes", the actual bonding process 8301 on the slave circuit can begin.

In loop 830 finally, another circuit is readied for the bonding process and subjected to the process flow as described above.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments. As an example, the computer-implemented method of the invention can be applied for re-creating illumination conditions in any slave machine, prepared to work on action sites of any slave object, and comprises the steps of:

generating input data, associated with a master machine, the data collected from a master object, related in geometry or history to the slave object, and comprising geometrical information of action sites and images of reference sites;

generating an analysis for constructing a network of relationships between the images of the reference sites and the geometrical information of action sites on the master object;

storing the network of relationships, the geometrical information and the images in a master file as an operational master program;

retrieving the master program for the slave machine;

generating input information, associated with the slave machine, the information collected from the slave object and comprising images of reference sites under various illumination conditions;

selecting illuminations and re-creating illumination conditions equivalent to the ones used when generating said master program;

generating input data, associated with said slave machine, said data collected from images under selected illumination conditions of reference sites on said slave object;

comparing said newly generated reference site images with said retrieved master reference site images;

compensating any shifts, rotations, scalings, or skewness found between said two sets of images; and re-computing said slave object action site locations based on said retrieved relationships between said reference locations and said action locations, thereby correcting said operational program of said slave machine for working on said action sites of said slave object.

We claim:

1. A computerized system for re-creating the illumination conditions for a slave object on a slave machine, comprising:

a master teacher operable to define images of illuminated reference sites of a master object on a master machine and to store the data related to said images and the image locations in a master file;

a slave regenerator, coupled to said master file, operable to regenerate said master reference image data so that the illumination conditions of said slave machine, as based on images, are recreated; and a slave corrector, coupled to said slave regenerator, operable to produce images of said slave object references under the newly created illumination conditions and to correct alignment and operations for said slave machine.

2. A computerized system for re-creating illumination conditions in a slave machine prepared to work on action sites of a slave object, comprising:

a first input data generator, associated with a master machine, operable to collect data from a master object which is related in geometry or history to said slave object, comprising geometrical information of action sites and images of illuminated reference sites;

an analysis generator, associated with said master machine and coupled to said first input data generator, operable to construct a network of relationships for said master machine between said images of reference sites and said geometrical information of action sites on said master object;

a master file, coupled to said analysis generator, operable to store said network of relationships, said geometrical information and said images as an operational master program;

a retriever, associated with said slave machine and coupled to said master file, operable to retrieve said operational master program;

a second input data generator, associated with said slave machine, operable to generate images of said reference sites on said slave object under various illumination conditions;

an illumination selector, associated with said slave machine and coupled to said retriever and said second input data generator, operable to recreate illumination conditions equivalent to the ones used when generating said master program;

a third input data generator associated with said slave machine, operable to generate images under selected illumination conditions of reference sites on said slave object; and a comparative corrector associated with said slave machine, coupled to said illumination selector and said third input data generator, operable to compare said newly generated alignment reference images with said retrieved master alignment references, to compensate any deviation found, and to re-compute said slave object point locations based on said retrieved relationships between said reference locations and said action locations, whereby said operational program of said slave machine is re-computed for working on said action sites of said slave objects.

3. A computerized system for re-creating the illumination conditions for a slave circuit on a slave bonder, comprising:

a master teacher operable to define images of illuminated alignment references of a master circuit on a master bonder and to store the data related to said images and the image locations in a master file;

a slave regenerator, coupled to said master file, operable to regenerate said master reference image data so that the illumination conditions of said slave bonder, as based on images, are recreated; and a slave corrector, coupled to said slave regenerator, operable to produce images of said slave circuit references under the newly recreated illumination conditions and to correct aligning and bonding for said slave bonder.

4. A computerized system for re-creating illumination conditions in a slave bonder prepared to attach connecting bonds onto bond pads of a slave integrated circuit, comprising:

a first input data generator, associated with a master bonder, operable to collect data from a master integrated circuit which is related in geometry to said slave integrated circuit, comprising geometrical information of bond pads and images of alignment references;

an analysis generator, associated with said master bonder and coupled to said first input data generator, operable to construct a network of relationships for said master bonder between said images of said alignment references and said geometrical information of said bond pads;

a master file, coupled to said analysis generator, operable to store said network of relationships, said geometrical information and said images as a master bond program;

a retriever, associated with said slave bonder and coupled to said master file, operable to retrieve said master bond program;

a second input data generator associated with said slave bonder, operable to generate images of said alignment references on said slave integrated circuit under various illumination conditions;

an illumination selector, associated with said slave bonder and coupled to said retriever and said second input data generator, operable to recreate illumination conditions equivalent to the ones used when generating said master program;

a third input data generator associated with said slave bonder, operable to generate images under selected illumination conditions of alignment references on said slave circuit; and a comparative corrector associated with said slave bonder, coupled to said illumination selector and said third input data generator, operable to compare said newly generated alignment reference images with said retrieved master alignment references, to compensate any deviation found and to re-compute said slave circuit point locations based on said retrieved relationships between said reference locations and said bond locations, whereby said bond program of said slave bonder is re-computed for bonding on said bond pads of said slave circuit.

5. The system according to claim 4 wherein said first input data generator comprises:

a first organizer operable to select alignment reference image points and sizes, to collect the x-y locations correlated to said points, and to store the x-y locations and size data in a reference image x-y file;

a selector, coupled to said first organizer, operable to select illumination conditions;

a collector, coupled to said selector, operable to select images of said alignment references, and to store said images in a reference image file; and a second organizer, coupled to said collector, operable to select bond pads, to collect x-y locations correlated to said bond pads, and to store said x-y locations data in a pad x-y file.

6. The system according to claim 5 wherein said input data for said first and second organizers and said collector are collected manually by an expert.

7. The system according to claim 4 wherein said bond program comprises bonding parameters for integrated circuit chip assembly.

8. The system according to claim 4 wherein said images are created by illumination, optics, and photographic cameras coupled to said computer-controlled bonders.

9. The system according to claim 4 wherein said master bonder is a computer-controlled independent bonder having well-understood characteristics.

10. The system according to claim 4 wherein said slave bonder is any computer-controlled bonder.

11. The system according to claim 4 wherein said master integrated circuit is an integrated circuit used as a reference circuit.

12. The system according to claim 4 wherein said slave integrated circuit is an integrated circuit identical in type to said master integrated circuit, said slave circuit to be bonded by said slave bonder.

13. The system according to claim 4 wherein said analysis generator comprises:

a computerized relations builder operable to select x-y locations of said bond pads and to express their mutual geometries and their relations to said alignment reference images in order to establish their interconnected network; and a file operable to store said interconnected network as said master bond program.

14. The system according to claim 4 wherein said interconnected network is expressed in equations comprising x-y as well as polar coordinates.

15. The system according to claim 4 wherein said retriever comprises:

an alignment reference image locations loader, coupled to said master file, operable to download said stored master alignment reference x-y locations data;

an alignment reference image loader, coupled to said master file and said reference locations loader, operable to download said stored master alignment reference image data;

a bond points loader, coupled to said master file and said reference image loader, operable to download said stored master bond pad x-y locations data; and a relationships loader, coupled to said master file and said bond points loader, operable to download said relationships between said master bond point locations and said master alignment reference images.

16. The system according to claim 4 wherein said illumination selector comprises:
   a computerized comparator, coupled to said alignment reference image loader in said retriever and to an input data generator acquiring alignment reference images of said slave integrated circuit, operable to compare said images for finding the best illumination match; and
   an illumination re-creator, coupled to said comparator, operable to recreate the equivalent illumination settings for each of the reference images replicating the setting used under said master program generation.

17. The system according to claim 4 wherein said comparative corrector comprises:
   a reference comparator, coupled to said master file and further to said third input data generator, operable to compare said alignment reference image stored in said master file with the alignment reference image input from said slave circuit, captured under the selected best illumination settings, and to quantify shifts, rotations, scalings and skewness between said two images or image parts;
   a computational corrector, coupled to said reference comparator and to said master file, operable to re-compute the bond pad locations on said slave circuit based on the quantitative data comparison from said comparator and said bond x-y locations data from said master file; and
   a computerized bonder, coupled to said computational corrector, operable as said slave bonder to attach connecting bonds onto the bond pads of said slave circuit directed by said re-computed bond pad locations of said computational corrector.

18. A computer-implemented method for re-creating the illumination conditions for a slave object on a slave machine, comprising the steps of:
   defining images of illuminated reference sites of a master object on a master machine and storing the data related to said images and the image locations in a master file;
   regenerating said master reference image data so that the illumination conditions of said slave machine, as based on images, are recreated; and
   producing images of said slave object references under the newly created illumination conditions and correcting alignment and operations for said slave machine.

19. A computer-implemented method for re-creating the illumination conditions in a slave machine prepared to work on action sites of slave objects, comprising the steps of:
   generating input data, associated with a master machine, said data collected from a master object, related in geometry or history to said slave object, and comprising geometrical information of action sites and images of illuminated reference sites;
   generating an analysis for constructing a network of relationships between said images of reference sites and said geometrical information of action sites on said master object;
   storing said network of relationships, said geometrical information and said images in a master file as an operational master program;
   retrieving said master program for said slave machine;
   generating input data, associated with said slave machine, said data collected from said slave object and comprising images of reference sites under various illumination conditions;
   selecting illuminations and re-creating illumination conditions equivalent to the ones used when generating said master program;
   generating input data, associated with said slave machine, said data collected from images under selected illumination conditions of reference sites on said slave object;
   comparing said newly generated reference site images with said retrieved master reference site images;
   compensating any shifts, rotations, scalings, or skewness found between said two sets of images; and
   re-computing said slave object action site locations based on said retrieved relationships between said reference locations and said action locations, thereby correcting said operational program of said slave machine for working on said action sites of said slave object.

20. A computer-implemented method for re-creating the illumination conditions for a slave circuit on a slave bonder, comprising the steps of:
   defining images of illuminated alignment references of a master circuit on a master bonder and storing the data related to said images and the image locations in a master file;
   regenerating said master reference image data so that the illumination conditions of said slave bonder, as based on images, are recreated; and
   producing images of said slave circuit references under the newly created illumination conditions and correcting alignment and bonding for said slave bonder.

21. A computer-implemented method for re-creating the illumination conditions in a slave bonder prepared to attach connecting bonds onto bond pads of a slave integrated circuit, comprising the steps of:
   generating input data associated with a master bonder, said data collected from a master integrated circuit, related in geometry to said slave integrated circuit, and comprising geometrical information of bond pads and images of alignment references;
   generating an analysis for constructing a network of relationships between said images of said alignment references and said geometrical information of said bond pads on said master circuit;
   storing said network of relationships, said geometrical information and said images in a master file as a master bond program;
   retrieving said master bond program for said slave bonder;
   generating input data, associated with said slave bonder, said data collected from said slave circuit and comprising images of said alignment references on said slave circuit under various illumination conditions;
   selecting illuminations and re-creating illumination conditions equivalent to the ones used when generating said master program;
   generating input data, associated with said slave bonder, said data collected from images acquired under said re-created illumination conditions of alignment references on said slave circuit;
   comparing said newly generated alignment reference images with said retrieved master alignment reference images;
   compensating any shifts, rotations, scalings, or skewness found between said two sets of images; and
   re-computing said slave circuit bond point locations based on said retrieved relationships between said reference locations and said bond point locations, thereby correcting said bond program of said slave bonder for bonding on said bond pads of said slave circuit.

22. The computer-implemented method according to claim 21 wherein said step of generating input data from said master circuit comprises:

selecting alignment reference points, collecting x-y locations correlated to said points, and storing said x-y locations data in a reference x-y file;

selecting images of said alignment references and storing said images in a reference image file; and selecting bond pads, collecting x-y locations correlated to said pads, and storing said x-y locations data in a x-y locations file.

23. The computer-implemented method according to claim 21 wherein said step of generating an analysis for constructing a network of relationships comprises:

selecting x-y locations of said bond pads;

expressing the mutual geometries of said x-y locations;

expressing the relations of said x-y locations to said alignment reference images;

establishing the interconnected network between said geometries and relations comprising equations expressed in x-y as well as polar coordinates; and storing said network, said geometries and said images in a file as the master bond program.

24. The computer-implemented method according to claim 21 wherein said step of retrieving said master bond program comprises:

downloading said stored master alignment reference x-y locations data;

downloading said stored master alignment reference images data;

downloading said stored master bond pad x-y locations data; and downloading said relationships between said master bond point locations and said master alignment reference image locations.

25. The computer-implemented method according to claim 21 wherein said step of generating input data from said slave circuit comprises:

selecting images of alignment references with various illumination settings; and storing said images in a slave image file.

26. The computer-implemented method according to claim 21 wherein said step of selecting comprises:

comparing said alignment reference images stored in said master bond program with said alignment reference images stored in said slave image file; and selecting the best illumination match, thereby re-creating illumination conditions equivalent to the ones used when generating said master program, and completing slave regeneration.

27. The computer-implemented method according to claim 21 wherein said step of comparing comprises:

capturing alignment reference images of said slave circuit, acquired with the best-matched illumination setting selected during slave regeneration;

comparing said newly captured alignment reference images with said retrieved master alignment reference images; and computing and compensating any rotation, shift, scaling, or skewness between said alignment reference images.

28. The computer-implemented method according to claim 21 wherein said step of correcting comprises:

retrieving said downloaded relationships between said master bond point locations and said master alignment reference image locations;

re-computing the x-y locations of said bond pads of said slave circuit based on said x-y locations of said bond pads in said master file and any of said shifts, rotations, scalings, or skewness found in said comparing step; and correcting said bond program of said slave bonder, thereby preparing said slave bonder to attach connecting bonds onto said bond pads of said slave circuit.

* * * * *